United States Patent
Byun

(10) Patent No.: US 10,768,839 B2
(45) Date of Patent: Sep. 8, 2020

(54) MEMORY SYSTEM AND OPERATING METHOD THEREOF

(71) Applicant: SK hynix Inc., Gyeonggi-do (KR)

(72) Inventor: Eu-Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/233,661

(22) Filed: Dec. 27, 2018

(65) Prior Publication Data
US 2020/0042180 A1 Feb. 6, 2020

(30) Foreign Application Priority Data
Aug. 3, 2018 (KR) .................. 10-2018-0090824

(51) Int. Cl.
| | |
|---|---|
| *G06F 12/00* | (2006.01) |
| *G06F 13/00* | (2006.01) |
| *G06F 13/28* | (2006.01) |
| *G06F 3/06* | (2006.01) |
| *G11C 11/56* | (2006.01) |
| *G11C 7/10* | (2006.01) |

(52) U.S. Cl.
CPC .......... *G06F 3/064* (2013.01); *G06F 3/0679* (2013.01); *G11C 7/109* (2013.01); *G11C 7/1063* (2013.01); *G11C 11/5628* (2013.01); *G11C 11/5642* (2013.01); *G06F 3/0604* (2013.01); *G06F 3/0614* (2013.01); *G06F 3/0629* (2013.01); *G11C 2211/5641* (2013.01)

(58) Field of Classification Search
CPC ...... G06F 3/0604; G06F 3/0614; G06F 3/064; G06F 3/0629

USPC ...................................................... 711/154
See application file for complete search history.

(56) References Cited

U.S. PATENT DOCUMENTS

| | | | |
|---|---|---|---|
| 8,954,655 B2 | 2/2015 | Jean et al. | |
| 9,141,528 B2 | 9/2015 | Gorobets et al. | |
| 2015/0193299 A1 | 7/2015 | Hyun et al. | |
| 2017/0139638 A1* | 5/2017 | Park | G11C 16/10 |
| 2017/0235489 A1 | 8/2017 | Lin et al. | |
| 2018/0211708 A1* | 7/2018 | Igahara | G11C 11/5628 |

FOREIGN PATENT DOCUMENTS

KR 101561546 10/2015

* cited by examiner

*Primary Examiner* — Edward J Dudek, Jr.
*Assistant Examiner* — Sidney Li
(74) *Attorney, Agent, or Firm* — IP & T Group LLP

(57) ABSTRACT

A memory system includes: a plurality of memory devices, each of which includes a first block and a second block; and a controller suitable for: storing data received from a host in a buffer; selecting a first block, of a memory device of the plurality of memory devices, to be programmed with the data; detecting a size of the data; controlling the memory device to program the data into the selected first block when the size is detected to be equal to a one-shot program size; determining a status of the memory device including the selected first block when the size is detected to be smaller than the one-shot program size; controlling the memory device to program the data into the selected first block when the memory device including the selected first block is determined to be in a first status; and controlling the memory device to program the data into the second block of the memory device when it is determined to be is a second status.

17 Claims, 13 Drawing Sheets

MEMORY SYSTEM AND OPERATING METHOD THEREOF

CROSS-REFERENCE TO RELATED APPLICATION

This application claims priority under 35 U.S.C. § 119(a) to Korean Patent Application No. 10-2018-0090824, filed on Aug. 3, 2018, which is incorporated herein by reference in its entirety.

BACKGROUND

1. Field

Various embodiments of the present invention relate to a semiconductor device, and more particularly, to a memory system and a method for operating the memory system.

2. Description of the Related Art

Recently, the paradigm for the computer environment has shifted to ubiquitous computing systems that can be used anytime and anywhere. As a result, the use of portable electronic devices such as mobile phones, digital cameras, and notebook computers has rapidly increased. In general, such portable electronic devices use a memory system which uses a memory device, that is, a data storage device. The data storage device is used as a main memory device or an auxiliary memory device of the portable electronic devices.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, and a solid state drive (SSD).

SUMMARY

Embodiments of the present invention are directed to a memory system and a method of operating the same, where the memory device is capable of reducing use of dummy data by selecting a block based on the size of data and the status of a memory device, thereby improving the performance of a write operation.

In accordance with an embodiment of the present invention, a memory system may include a plurality of memory devices, each of which includes a first block and a second block; and a controller suitable for: storing data received from a host in a buffer; selecting a first block, of a memory device of the plurality of memory devices, to be programmed with the data; detecting a size of the data; controlling the memory device to program the data into the selected first block when the size is detected to be equal to a one-shot program size; determining a status of the memory device including the selected first block when the size is detected to be smaller than the one-shot program size; controlling the memory device to program the data into the selected first block when the memory device including the selected first block is determined to be in a first status; and controlling the memory device to program the data into the second block of the memory device when it is determined to be is a second status.

In accordance with another embodiment of the present invention, a method for operating a memory system including a plurality of memory devices, each of which includes a first block and a second block, and a controller suitable for controlling the memory devices, the method may comprise storing data received from a host in a buffer; selecting a first block of a memory device of the plurality of memory devices, to be programmed with the data; detecting a size of the data; controlling the memory device including the selected first block to program the data into the selected first block when the size is detected to be equal to a one-shot program size; determining a status of the memory device including the selected first block when the size is detected to be smaller than the one-shot program size; controlling the memory device to program the data into the selected first block when the memory device including the selected first block is in a first status; and controlling the memory device to program the data into the second block when the memory device including the selected first block is in a second status.

In accordance with another embodiment of the present invention, a memory system may comprise a memory device including first cells and second cells; and a controller suitable for: controlling the memory device to perform a one-shot program operation of storing target data into the first cells when a size of the target data is compatible with the one-shot program operation; controlling the memory device to perform the one-shot program operation of storing the target data and dummy data into the first cells when the size of the target data is not compatible with the one-shot program operation and the memory device is idle; and controlling the memory device to perform a normal program operation of storing the target data into the second cells when the size of the target data is not compatible with the one-shot program operation and the memory device is busy, wherein each of the first cells has a greater storage capacity than each of the second cells, and each of the second cells accommodates a faster storage speed than that of each of the first cells.

DETAILED DESCRIPTION

Figure 1:
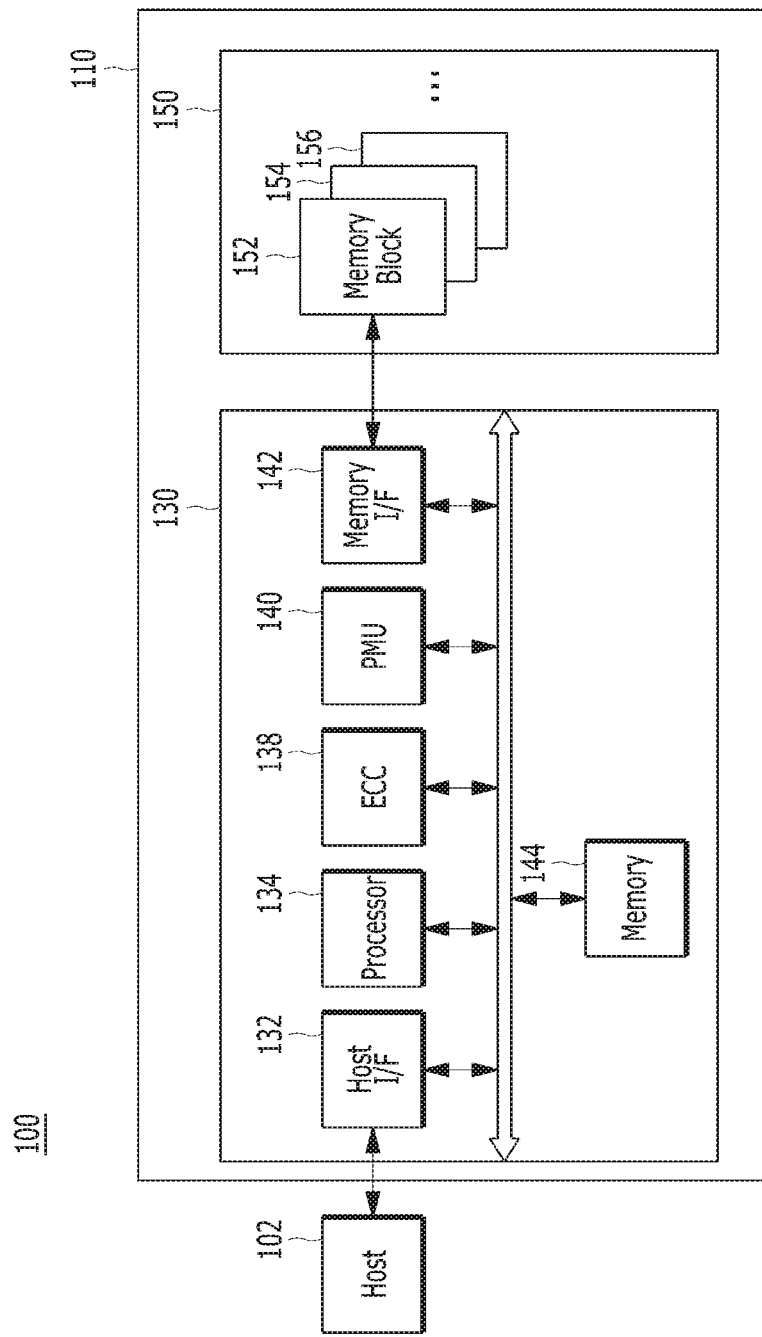
FIG. 1 is a block diagram schematically illustrating a data processing system including a memory system in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

FIG. 1 is a block diagram illustrating a data processing system 100 including a memory system in accordance with an embodiment.

Referring to FIG. 1, the data processing system 100 may include a host 102 and a memory system 110.

The host 102 may be realized by any of a wide variety of electronic devices, for example, portable electronic devices such as a mobile phone, an MP3 player and a laptop computer or electronic devices such as a desktop computer, a game machine, a television (TV) and a projector, that is, wired and wireless electronic devices.

Also, the host 102 includes at least one operating system (OS). The operating system generally manages and controls the functions and operations of the host 102, and provides interoperability between the host 102 and a user using the data processing system 100 or the memory system 110. The operating system supports functions and operations corresponding to the purpose and use of the operating system. For example, the operating system may be a general operating system or a mobile operating system depending on the mobility of the host 102. The general operating system may be a personal operating system or an enterprise operating system depending on the user's usage environment. For example, the personal operating system configured to support a service providing function for a general user may include Windows and Chrome, and the enterprise operating system configured to secure and support high performance may include Windows server, Linux and Unix. The mobile operating system configured to support a mobility service providing function and a system power saving function to users may include Android, iOS, Windows mobile, etc. The host 102 may include a plurality of operating systems, and executes the operating systems to perform operations with the memory system 110 in correspondence to a user request. The host 102 transmits a plurality of commands corresponding to a user request to the memory system 110, and accordingly, the memory system 110 performs operations corresponding to the commands, that is, operations corresponding to the user request.

The memory system 110 operates in response to a request of the host 102, and, in particular, stores data to be accessed by the host 102. In other words, the memory system 110 may be used as a main memory device or an auxiliary memory device of the host 102. The memory system 110 may be implemented as any one of various kinds of storage devices, depending on a host interface protocol which is coupled with the host 102. For example, the memory system 110 may be implemented as any one of a solid state driver (SSD), a multimedia card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

The storage devices which implement the memory system 110 may be a volatile memory device such as a dynamic random access memory (DRAM) and/or a static random access memory (SRAM) or a nonvolatile memory device such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM) and/or a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). In the case where the memory system 110 is used as an SSD, the operating speed of the host 102 which is coupled to the memory system 110 may be improved. The controller 130 and the memory device 150 may be integrated into one semiconductor device to form a memory card such as a personal computer memory card international association (PCMCIA) card, a compact flash (CF) card, a smart media card (e.g., an SM and an SMC), a memory stick, a multimedia card (e.g., an MMC, an RS-MMC and a micro-MMC), a secure digital card (e.g., an SD, a mini-SD, a micro-SD and an SDHC), and/or a universal flash storage (UFS) device.

In another embodiment, the memory system 110 may be disposed in a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may retain stored data even though power is not supplied. In particular, the memory device 150 stores the data provided from the host 102 through a write operation, and provides stored data to the host 102 through a read operation. The memory device 150 includes a plurality of memory blocks 152, 154 and 156, each of which includes a plurality of pages. Each of the pages includes a plurality of memory cells to which a plurality of word lines (WL) are coupled. Also, the memory device 150 includes a plurality of planes, each of which includes a plurality of memory blocks, e.g., blocks 152, 154 and 156. In particular, the memory device 150 may include a plurality of memory dies, each of which includes a plurality of planes. The memory device 150 may be a nonvolatile memory device, for example, a flash memory. The flash memory may have a three-dimensional (3D) stack structure.

Detailed description of the structure of the memory device 150 including the 3D stack structure is given below with reference to FIGS. 2 to 4.

The controller 130 controls the memory device 150 in response to a request from the host 102. For example, the controller 130 provides the data read from the memory device 150 to the host 102, and stores the data provided from the host 102 in the memory device 150. To this end, the controller 130 controls the operations of the memory device 150, such as read, write, program and erase operations.

The controller 130 includes a host interface (I/F) 132, a processor 134, an error correction code (ECC) component 138, a power management unit (PMU) 140, a memory interface (I/F) 142 and a memory 144.

The host interface 132 processes the commands and data of the host 102, and may be configured to communicate with the host 102 through at least one of various interface protocols such as universal serial bus (USB), multimedia card (MMC), peripheral component interconnect express (PCI-e or PCIe), serial attached SCSI (SAS), serial advanced technology attachment (SATA), parallel advanced technology attachment (PATA), small computer system interface (SCSI), enhanced small disk interface (ESDI), integrated drive electronics (IDE) and mobile industry processor interface (MIPI). The host interface 32 may be driven through a firmware referred to as a host interface layer (HIL), which is a region which exchanges data with the host 102.

The ECC component 138 corrects an error bit of the data processed in the memory device 150, and may include an ECC encoder and an ECC decoder. The ECC encoder may encode data to be programmed in the memory device 150 and generate data added with parity bits. The data added with parity bits may be stored in the memory device 150. The ECC decoder detects and corrects an error in the data read from the memory device 150. That is to say, after performing error correction decoding for the data read from the memory device 150, the ECC component 138 may determine whether the error correction decoding has succeeded, output a signal indicative of the determined result, for example, an error correction success/failure signal, and correct an error bit of the read data by using the parity bits generated in the ECC encoding process. The ECC component 138 may be unable to correct error bits when the number of error bits is above a correctable error bit limit, and may output an error correction fail signal indicating that it is incapable of correcting the error bits.

The ECC component 138 may perform error correction by using, but not limited to, a low density parity check (LDPC) code, a Bose, Chaudhuri, Hocquenghem (BCH) code, a turbo code, a Reed-Solomon (RS) code, a convolution code, a recursive systematic code (RSC), trellis-coded modulation (TCM) or Block coded modulation (BCM). The ECC component 138 may include any and all circuits, modules, systems or devices for suitable error correction.

The PMU 140 provides and manages power for the controller 130, that is, power for the component elements included in the controller 130.

The memory interface 142 serves as a memory and storage interface, which performs interfacing between the controller 130 and the memory device 150, to allow the controller 130 to control the memory device 150 in response to a request from the host 102. The memory interface 142 generates control signals for the memory device 150 and processes data according to the control of the processor 134, functioning as a NAND flash controller (NFC) in the case where the memory device 150 is a flash memory, in particular, a NAND flash memory. The memory interface 142 may support the operation of an interface which processes a command and data between the controller 130 and the memory device 150, for example, a NAND flash interface, in particular, data input/output between the controller 130 and the memory device 150. The memory interface 142 may be driven through firmware referred to as a flash interface layer (FIL), which is a region which exchanges data with the memory device 150.

The memory 144, as the working memory of the memory system 110 and the controller 130, stores data for driving of the memory system 110 and the controller 130. For example, when the controller 130 controls the memory device 150 in response to a request from the host 102, the controller 130 may provide data read from the memory device 150 to the host 102, and/or store data provided from the host 102 in the memory device 150. To this end, when the controller 130 controls the operations of the memory device 150, such as read, write, program and erase operations, the memory 144 stores data needed to allow such operations to be performed by the memory system 110, that is, between the controller 130 and the memory device 150.

The memory 144 may be realized by a volatile memory. For example, the memory 144 may be realized by a static random access memory (SRAM) or a dynamic random access memory (DRAM). Furthermore, the memory 144 may disposed within the controller 130 as shown in FIG. 1. Alternatively, the memory 144 may external to the controller 130, and in this regard, may be realized as a separate external volatile memory in communication with the controller 130 through a memory interface.

As described above, the memory 144 stores data needed to perform data read and write operations between the host 102 and the memory device 150 and data when performing the data read and write operations. For such data storage, the memory 144 includes a program memory, a data memory, a write buffer/cache, a read buffer/cache, a data buffer/cache, a map buffer/cache, and the like.

The processor 134 controls the entire operations of the memory system 110, and in particular, controls a program operation or a read operation for the memory device 150, in response to a write request or a read request from the host 102. The processor 134 drives firmware referred to as a flash translation layer (FTL), to control the general operations of the memory system 110. The processor 134 may be realized by a microprocessor or a central processing unit (CPU).

For instance, the controller 130 performs an operation requested from the host 102, in the memory device 150, that is, performs a command operation corresponding to a command received from the host 102, with the memory device 150, through the processor 134. The controller 130 may perform a foreground operation as a command operation corresponding to a command received from the host 102, for example, a program operation corresponding to a write command, a read operation corresponding to a read command, an erase operation corresponding to an erase command or a parameter set operation corresponding to a set parameter command or a set feature command as a set command.

The controller 130 may also perform a background operation for the memory device 150 through the processor 134. The background operation for the memory device 150 includes an operation of copying the data stored in one memory block, among the memory blocks 152, 154 and 156 of the memory device 150, to another memory block. Such a background operation may be a garbage collection (GC) operation, an operation of swapping among the memory blocks 152, 154 and 156 or data stored therein, e.g., a wear leveling (WL) operation, an operation of storing map data stored in the controller 130 in the memory blocks 152, 154 and 156, e.g., a map flush operation, or an operation of performing bad block management for the memory device 150, for example, an operation of identifying and processing a bad block among the memory blocks 152, 154 and 156 in the memory device 150.

A management unit (not shown) for performing bad block management for the memory device 150 may be included in the processor 134 of the controller 130. The management unit identifies a bad block in the plurality of memory blocks 152, 154 and 156 in the memory device 150, and then, performs bad block management of processing the bad block and labeling it as bad. The bad block management, in the case where the memory device 150 is a flash memory, for example, a NAND flash memory, is used when a program fail may occur when performing data write, for example, data program, due to the characteristic of the NAND flash memory. A memory block where the program fail has occurred is processed and labeled as a bad block, and program-failed data are written, that is, programmed, in a new memory block. Moreover, in the case where the memory device 150 has a 3-dimensional stack structure as described above, if a corresponding block is processed as a bad block according to a program fail, because the utilization efficiency of the memory device 150 and the reliability of the memory system 110 may deteriorate abruptly, it is necessary to reliably perform bad block management. A memory device in the memory system in accordance with embodiments of the present disclosure is described below in detail with reference to FIGS. 2 to 4.

Figure 2:
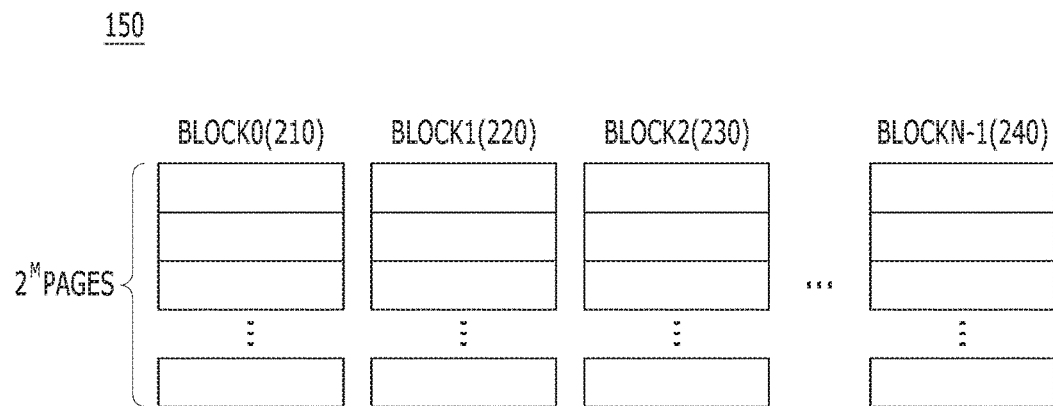
FIG. 2 is a diagram schematically illustrating a memory device in a memory system in accordance with an embodiment of the present invention.
Figure 3:
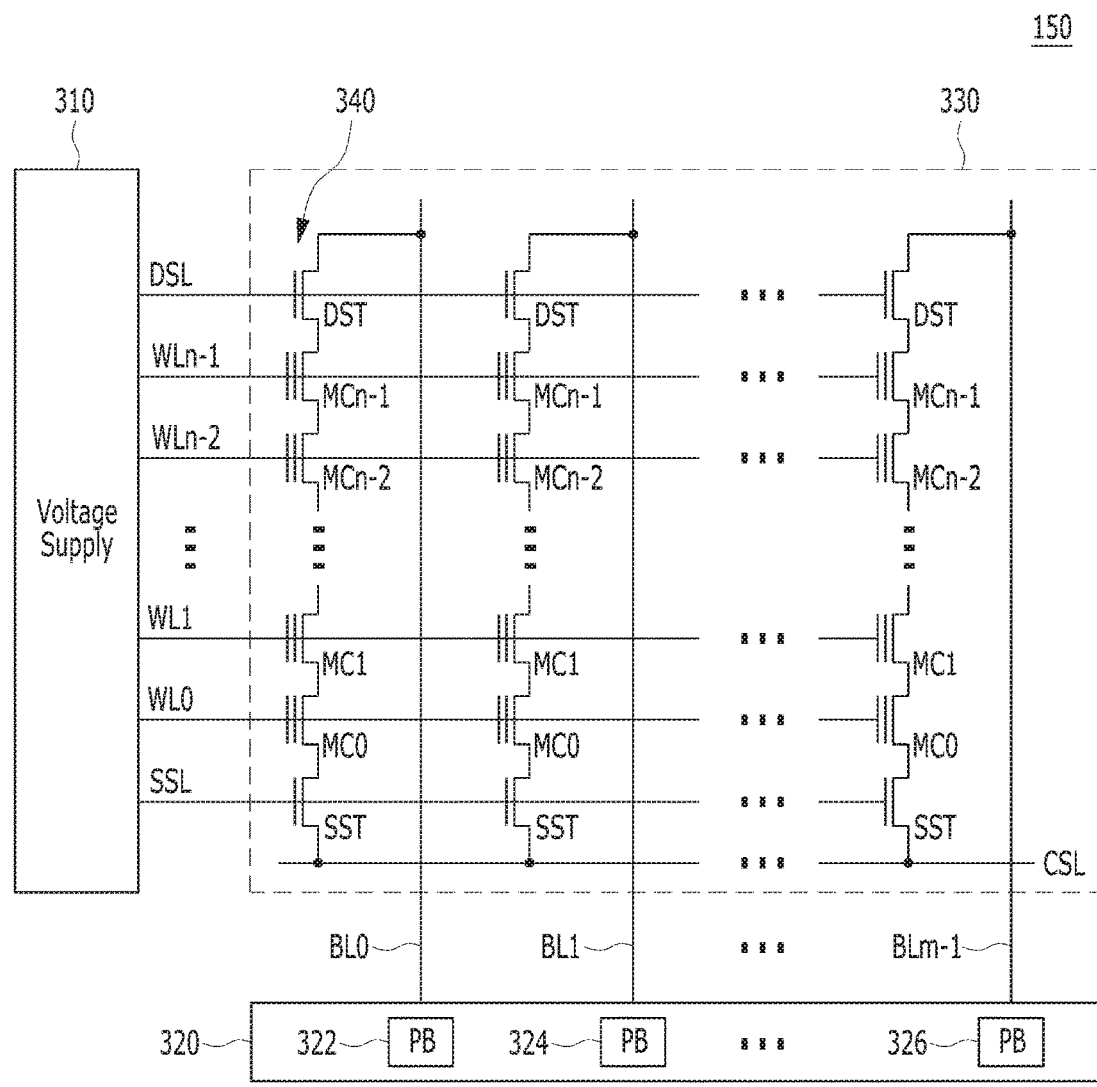
FIG. 3 is a diagram schematically illustrating a memory cell array circuit of a memory block in a memory device in accordance with an embodiment of the present invention.
Figure 4:
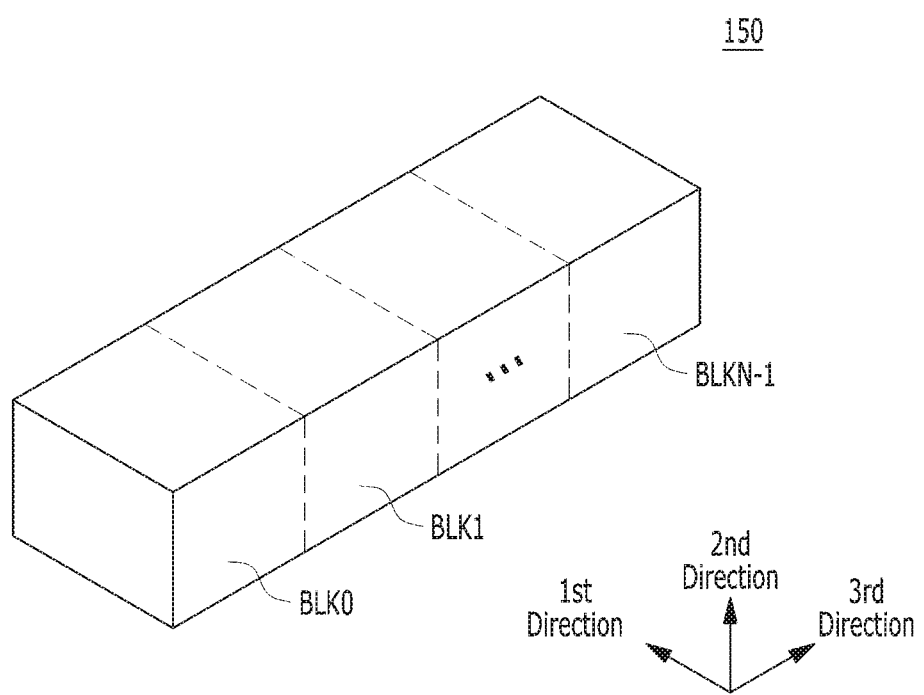
FIG. 4 is a diagram schematically illustrating a memory device in a memory system in accordance with an embodiment of the present invention.

FIG. 2 is a diagram illustrating a memory device in a memory system, FIG. 3 is a diagram illustrating a memory cell array circuit of a memory block in a memory device, and FIG. 4 is a diagram illustrating a structure of a 3-dimensional nonvolatile memory device.

Referring to FIG. 2, the memory device 150 includes a plurality of memory blocks, for example, a zeroth block (BLOCK0) 210, a first block (BLOCK1) 220, a second block (BLOCK2) 230 and an (N−1)th block (BLOCKN−1) 240. Each of the blocks 210, 220, 230 and 240 includes a plurality of pages, for example, $2^M$ or M pages. Each of the pages includes a plurality of memory cells to which a plurality of word lines (WL) are coupled.

The memory device 150 may include single level cell (SLC) memory blocks and/or multi-level cell (MLC) memory blocks, depending on the number of bits to be stored in or expressed by one memory cell. An SLC memory block includes a plurality of pages which are realized by memory cells each storing 1 bit, and has high data calculation performance and high durability. An MLC memory block includes a plurality of pages which are realized by memory cells each storing multi-bit data (for example, 2 or more bits), and has a larger data storage space than the SLC memory block, that is, is capable of being highly integrated. In particular, the memory device 150 may include, as MLC memory blocks, an MLC memory block including a plurality of pages which are realized by memory cells each capable of storing 2-bit data, a triple level cell (TLC) memory block including a plurality of pages which are realized by memory cells each capable of storing 3-bit data, a quadruple level cell (QLC) memory block including a plurality of pages which are realized by memory cells each capable of storing 4-bit data, or a higher-multiple level cell memory block including pages which are realized by memory cells each capable of storing 5 or more-bit data.

While it is described as an example that the memory device 150 is realized by a nonvolatile memory such as a flash memory, for example, a NAND flash memory, it is noted that the memory device 150 may be implemented as any of multiple types of memories such as a phase change memory (i.e., phase change random access memory (PCRAM)), a resistive memory (i.e., resistive random access memory (RRAM or ReRAM)), a ferroelectric memory (i.e., ferroelectric random access memory (FRAM)) and a spin transfer torque magnetic memory (i.e., spin transfer torque magnetic random access memory (STT-RAM or STT-MRAM)).

Each of the memory blocks 210, 220, 230 and 240 stores the data provided from the host 102 of FIG. 1, through a write operation, and provides stored data to the host 102, through a read operation.

Referring to FIG. 3, memory block 330 is representative of any of the plurality of memory blocks 152, 154 and 156 in the memory device 150 of the memory system 110. Each memory block 330 may include a plurality of cell strings 340 which are realized as a memory cell array and are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors SST and DST. The respective memory cells MC0 to MCn−1 may be constructed by multi-level cells (MLC) each of which stores data or information of a plurality of bits. The cell strings 340 may be electrically coupled to corresponding bit lines BL0 to BLm−1, respectively.

While FIG. 3 shows, as an example, each memory block 330 constructed by NAND flash memory cells, it is noted that each of the plurality of memory blocks 152,154,156 is not limited to a NAND flash memory and may be realized by a NOR flash memory, a hybrid flash memory in which at least two kinds of memory cells are combined, or a one-NAND flash memory in which a controller is built in a memory chip. The memory device 150 may be realized as not only a flash memory device in which a charge storing layer is constructed by conductive floating gates but also a charge trap flash (CTF) memory device in which a charge storage layer is constructed by a dielectric layer.

A voltage supply circuit 310 of the memory device 150 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply circuit 310 may be performed by the control of a control circuit (not shown). The voltage supply circuit 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 150 is controlled by a control circuit (not shown), and may operate as a sense amplifier or a write driver according to an operation mode. In a verify/normal read operation, the read/write circuit 320 may operate as a sense amplifier for reading data from the memory cell array. In a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not shown) may be included in each of the page buffers 322, 324 and 326.

The memory device 150 may be realized as a 2-dimensional or 3-dimensional memory device. In particular, as shown in FIG. 4, the memory device 150 may be realized as a nonvolatile memory device with a three-dimensional stack structure. In the case where the memory device 150 is realized as a three-dimensional structure, the memory device 150 may include a plurality of memory blocks BLK0 to BLKN–1.

FIG. 4 illustrates the memory blocks 152, 154 and 156 of the memory device 150 shown in FIG. 1. Each of the memory blocks 152, 154 and 156 may be realized as a 3-dimensional structure (or a vertical structure). For example, the respective memory blocks 152, 154 and 156 may be realized as a 3-dimensional structure which extends in first to third directions, for example, the x-axis direction, the y-axis direction and the z-axis direction.

Each memory block 330 may include a plurality of NAND strings NS which extend in the second direction, and a plurality of NAND strings NS which extend in the first direction and the third direction. Each NAND string NS may be coupled to a bit line BL, at least one string select line SSL, at least one ground select line GSL, a plurality of word lines WL, at least one dummy word line DWL and a common source line CSL, and may include a plurality of transistor structures TS.

Namely, each memory block 330 may be coupled to a plurality of bit lines BL, a plurality of string select lines SSL, a plurality of ground select lines GSL, a plurality of word lines WL, a plurality of dummy word lines DWL and a plurality of common source lines CSL, and accordingly, may include a plurality of NAND strings NS. Also, in each memory block 330, a plurality of NAND strings NS may be coupled to one bit line BL, and a plurality of transistors may be realized in one NAND string NS. A string select transistor SST of each NAND string NS may be coupled to a corresponding bit line BL, and a ground select transistor GST of each NAND string NS may be coupled to the common source line CSL. Memory cells MC may be provided between the string select transistor SST and the ground select transistor GST of each NAND string NS. Namely, a plurality of memory cells may be realized in each memory block 330.

Figure 5:
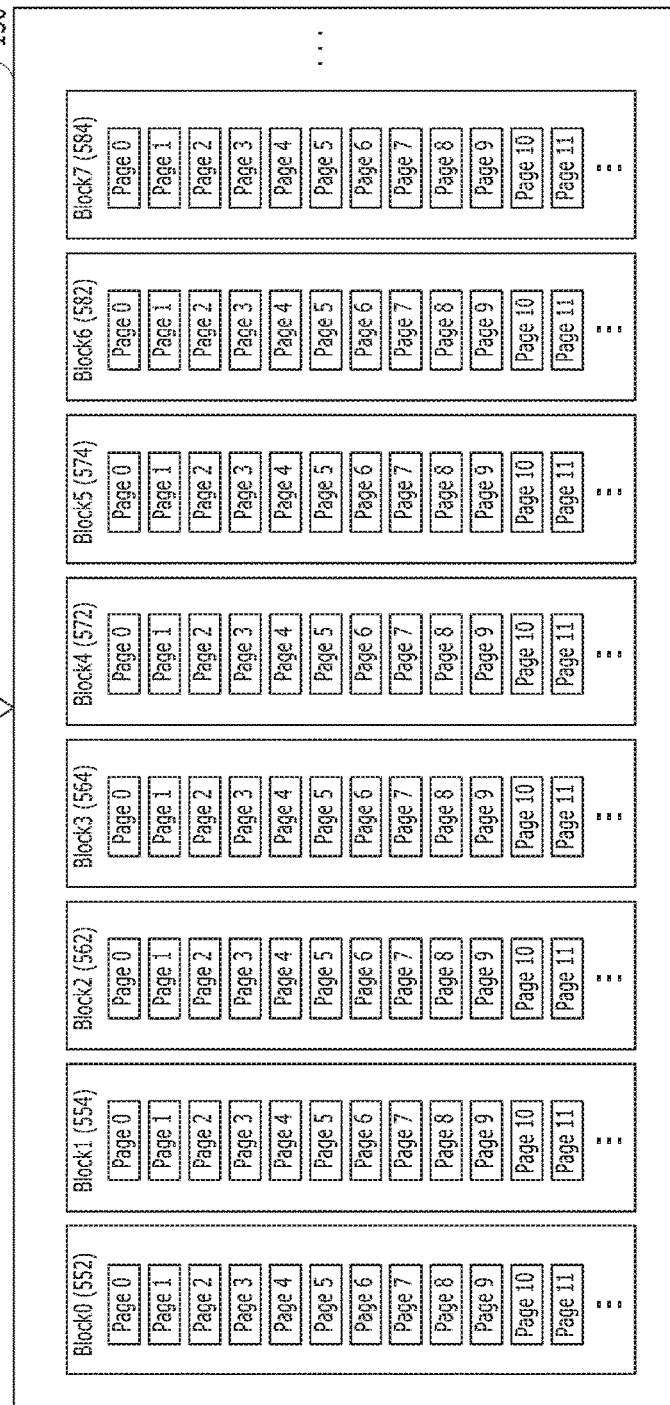
FIG. 5 is a diagram illustrating a data processing operation with respect to a memory device in a memory system in accordance with an embodiment. of the present invention.

FIG. 5 is a diagram illustrating a data processing operation with respect to a memory device in a memory system in accordance with an embodiment.

Referring to FIG. 5, the controller 130 performs a command operation corresponding to a command received from the host 102, for example, a program operation corresponding to a program command. The controller 130 programs and stores user data corresponding to the program command in the plurality of pages in memory blocks 552, 554, 562, 564, 572, 574, 582 and 584 of the memory device 150.

The controller 130 generates and updates metadata for the user data, and programs and stores the metadata in the memory blocks 552, 554, 562, 564, 572, 574, 582 and 584 of the memory device 150. The metadata include logical to physical (logical/physical or L2P) information and physical to logical (physical/logical or P2L) information for the user data stored in the memory blocks 552, 554, 562, 564, 572, 574, 582 and 584. Also, the metadata may include information on command data corresponding to a command received from the host 102, information on a command operation corresponding to the command, information on the memory blocks of the memory device 150 for which the command operation is to be performed, and information on map data corresponding to the command operation. In other words, metadata may include all information and data, excluding user data, corresponding to a command received from the host 102.

For example, the controller 130 caches and buffers user data corresponding to a program command received from the host 102 in a first buffer 510 of the controller 130. That is, the controller 130 stores data segments 512 of the user data in the first buffer 510 as a data buffer/cache. The first buffer 510 may be included in the memory 144 of the controller 130. Thereafter, the controller 130 programs and stores the data segments 512 stored in the first buffer 510 in the pages included in the memory blocks 552, 554, 562, 564, 572, 574, 582 and 584 of the memory device 150.

As the data segments 512 of the user data are programmed and stored in the pages in the memory blocks 552, 554, 562, 564, 572, 574, 582 and 584, the controller 130 generates L2P segments 522 and P2L segments 524 as metadata. Then, the controller 130 stores the L2P segments 522 and the P2L segments 524 in a second buffer 520 of the controller 130. The second buffer 520 may be included in the memory 144 of the controller 130. In the second buffer 520, the L2P segments 522 and the P2L segments 524 may be stored in the form of a list. Then, the controller 130 programs and stores the L2P segments 522 and the P2L segments 524 in the pages in the memory blocks 552, 554, 562, 564, 572, 574, 582 and 584 through a map flush operation.

The controller 130 performs a command operation corresponding to a command received from the host 102. For example, the controller 130 performs a read operation corresponding to a read command. The controller 130 checks L2P segments 522 and P2L segments 524 of user data corresponding to the read command by loading them in the second buffer 520. Then, the controller 130 reads data segments 512 of the user data from a storage position known through the checking. That is, the controller 130 reads the data segments 512 from a specific page of a specific memory block among the memory blocks 552, 554, 562, 564, 572, 574, 582 and 584. Then, the controller 130 stores the data segments 512 in the first buffer 510, and provides the data segments 512 to the host 102.

Figure 6:
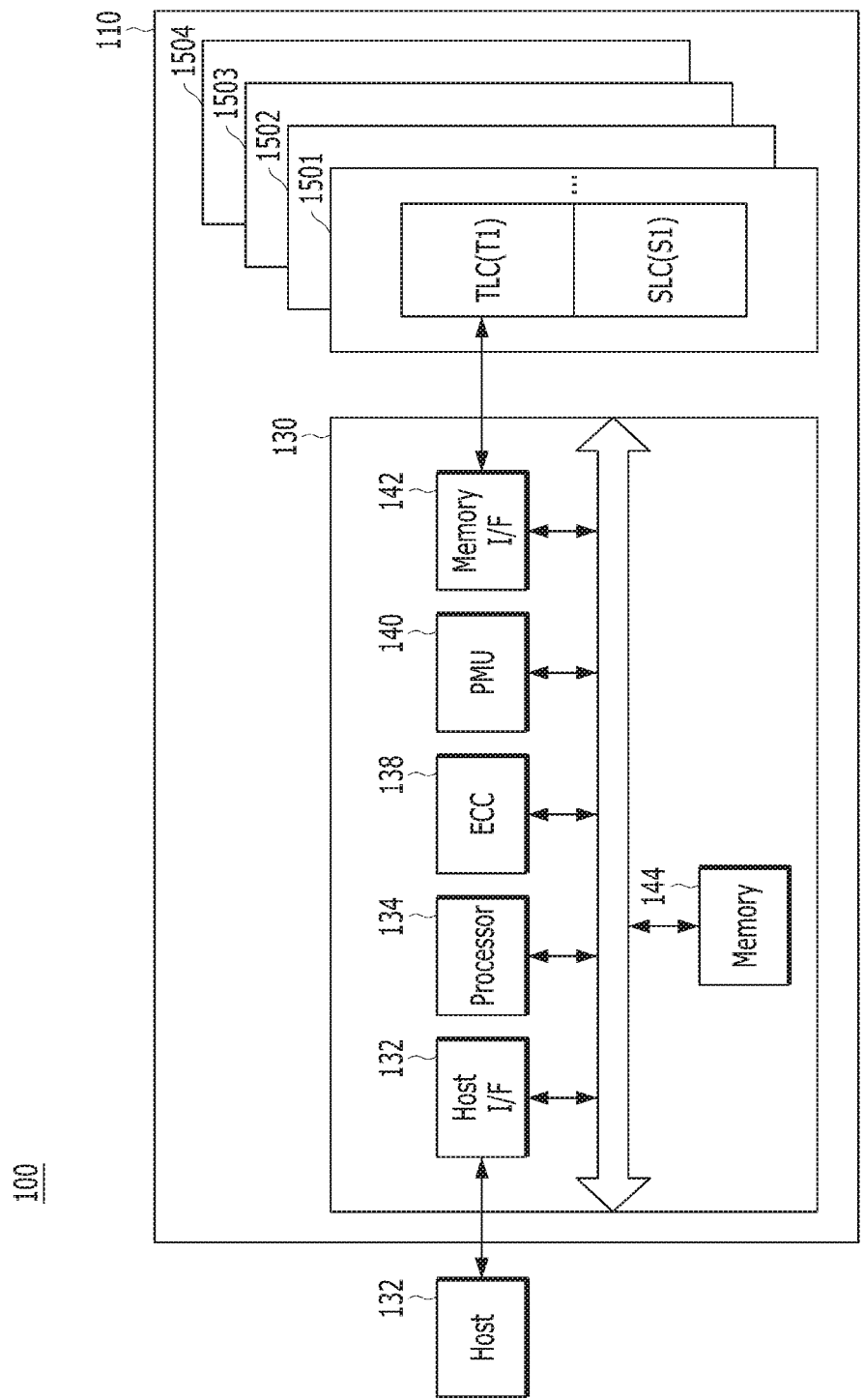
FIGS. 6 to 8 are block diagrams illustrating an operation of a memory system in accordance with an embodiment of the present invention.
Figure 7:
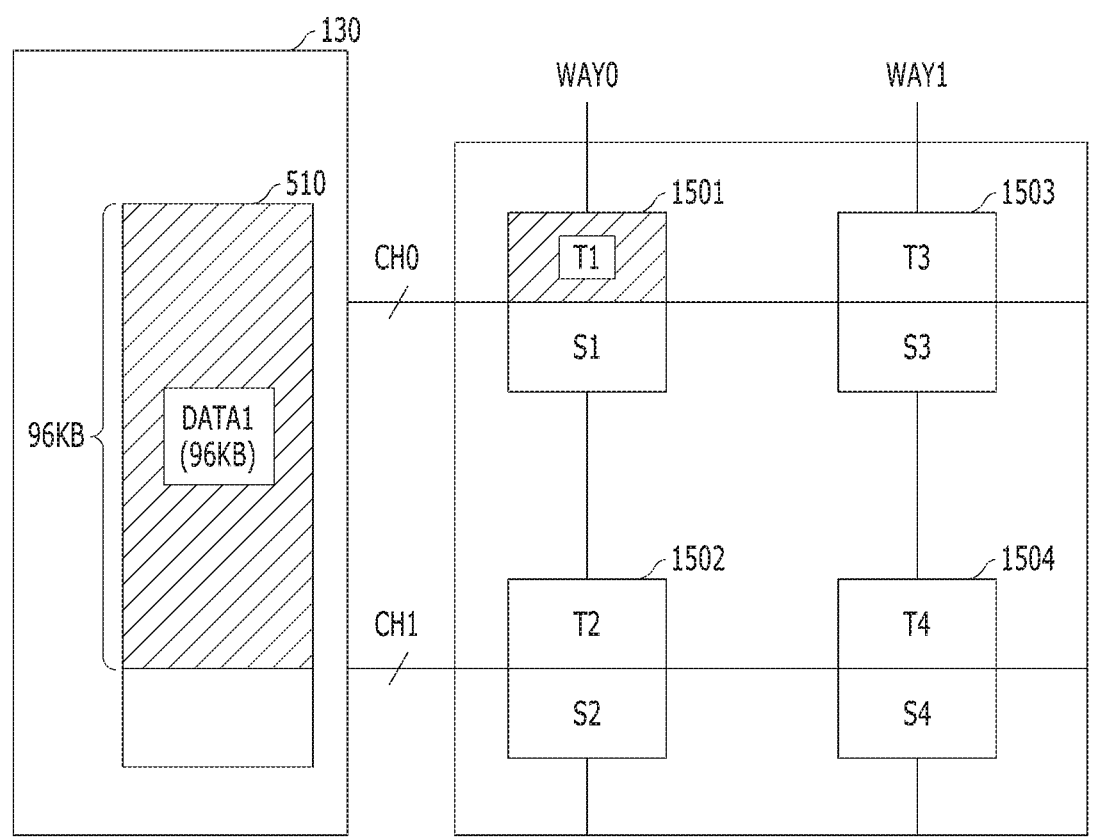
Figure 8:
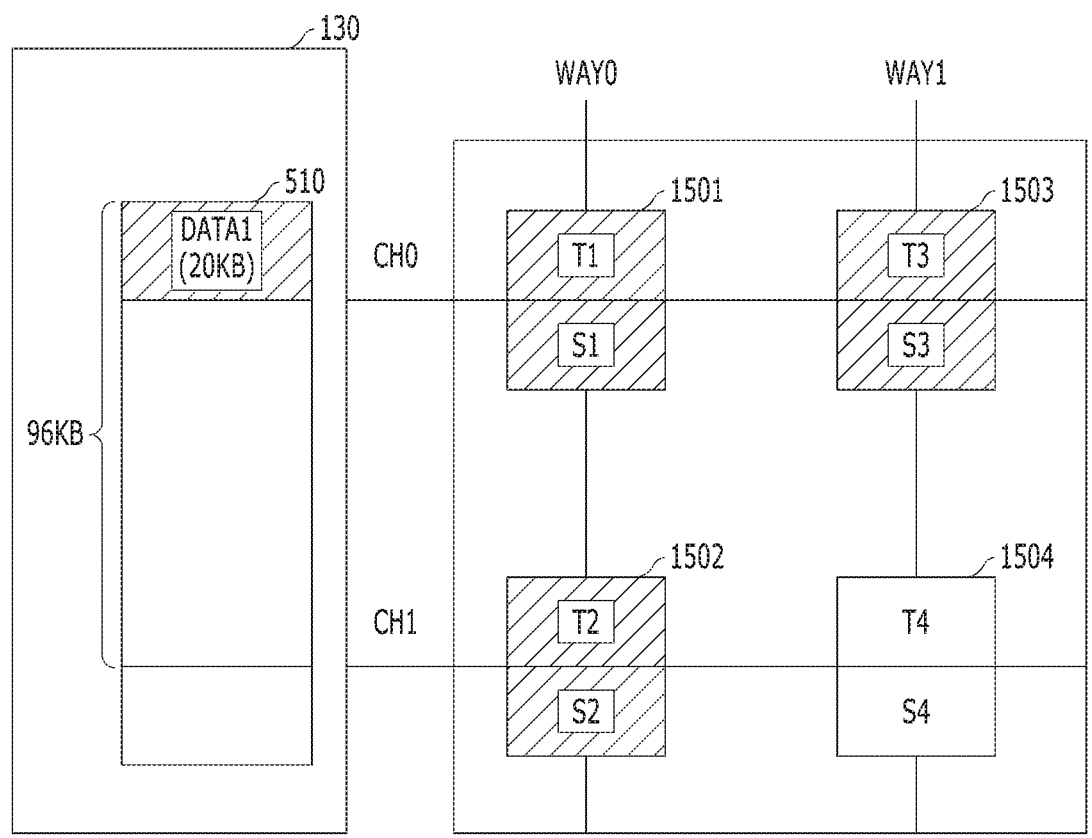

FIGS. 6 to 8 are block diagrams illustrating an operation of a memory system, e.g., memory system 100, in accordance with an embodiment of the present invention.

Referring to FIG. 6, when the controller 130 receives a plurality of commands from the host 102, the controller 130 may perform command operations corresponding to the received commands on a plurality of memory blocks that are included in a plurality of memory devices 1501, 1502, 1503 and 1504. For example, the controller 130 may perform program operations corresponding to a plurality of received write commands in the memory blocks in the memory devices 1501, 1502, 1503 and 1504. Each of the memory devices 1501, 1502, 1503 and 1504 may correspond to one memory device 150, which is described with reference to FIG. 1.

To be specific, when the controller 130 receives a plurality of write commands from the host 102, the controller 130 may detect the size and type of the data corresponding to the write commands. The data corresponding to the write commands may include user data and meta-data. The controller 130 may store segments 720 of the data corresponding to the write commands in the memory 144 of the controller 130. When the segments 720 are data segments of the user data, the segments 720 may be stored in the first buffer 510 in the memory 144. When the segments 720 are meta-segments of the meta-data, the segments 720 may be stored in a second buffer 520 of the memory 144. For purpose of description, and by way of example, the segments 720 of the data corresponding to the write commands received from the host 102 are data segments of the user data. However, the present invention is not limited in that way; rather, the present invention may be applied even to a case where the segments 720 of the data corresponding to the write commands received from the host 102 are meta-segments of meta-data.

When the controller 130 performs the program operations, the controller 130 may store data corresponding to the write commands in the memory blocks of the memory devices 1501, 1502, 1503 and 1504 based on the data size and the data type. To be specific, each of the memory devices 1501, 1502, 1503 and 1504 may include a first block and a second block. The first block may include a multi-level cell, that is, a memory cell capable of storing a data of multiple bits in one memory cell, as described in FIG. 3. For example, a multi-level cell in a first block of each of the memory devices 1501, 1502, 1503 and 1504 may be a triple level cell (TLC) capable of storing a data of 3 bits or a quadruple level cell (QLC) capable of storing a data of 4 bits in one memory cell. By way of example, the multi-level cell in the first block is a triple level cell (TLC). Of course, such multi-level cell in the first block of each of the memory devices 1501, 1502, 1503 and 1504 may store other numbers of multiple bits, e.g., 2 or 4 or more, in one memory cell according to system design. A second block of each of the memory devices 1501, 1502, 1503 and 1504 may include a single level cell (SLC), that is, a memory cell capable of storing a one-bit data in one memory cell, as described in FIG. 3.

The controller 130 may use a one-shot programming method when data is programmed into the first block of each of the memory devices 1501, 1502, 1503 and 1504. The one-shot programming method may mean an operation of programming data of multiple bits into a multi-level cell by performing a program operation once. The size of a data for performing the one-shot program operation without dummy data in one page in the first block of the first memory device 1501 may be defined as the one-shot program size. In the illustrated embodiment, the one-shot program size is 96 KB. However, in another embodiment, the one-shot program size may be larger or smaller than 96 KB according to system design considerations. The memory devices 1501, 1502, 1503 and 1504 may operate in an interleaving scheme. To this end, the memory devices 1501, 1502, 1503 and 1504 may be coupled to each other through two channels CH0 and CH1 and two paths WAY0 and WAY1 (see FIGS. 7 and 8). As an example, the first block may be represented as a TCL block, and the second block may be represented as an SLC block. In other words, among the memory devices 1501, 1502, 1503 and 1504, the first memory device 1501 may include a first TLC block T1 and a first SLC block S1, and the second memory device 1502 may include a second MLC block T2 and a second SLC block S2, and the third memory device 1503 may include a third TLC block T3 and a third SLC block S3, and the fourth memory device 1504 may include a fourth TLC block T4 and a fourth SLC block S4.

Referring to FIGS. 7 and 8, these figures show a method of selecting one block between a TLC block and an SLC block that are included in each of the memory devices based on the data size received by the controller 130 and programming the selected block with a data.

FIG. 7 illustrates how the controller 130 performs control, when data inputted from the host 102 has the one-shot program size that may be programmed in the TLC block T1.

Referring to FIG. 7, the controller 130 may store first data DATA1 inputted from the host 102 in a first buffer 510. The controller 130 may detect the usage size of the first buffer 510, in which the first data DATA1 is stored, with reference to the one-shot program size, e.g., 96 KB. As a result, it may be detected that the usage size of the first buffer 510 is the one-shot program size, e.g., 96 KB. Therefore, the controller 130 may control the program operation of storing the first data DATA1, which is stored in the first buffer 510, in one TLC block among the TLC blocks of the memory devices 1501, 1502, 1503 and 1504 without dummy data in the first buffer 510. Initially, none of the memory devices 1501, 1502, 1503 and 1504 are performing any operations. Therefore, when the first memory device 1501 among the memory devices 1501, 1502, 1503 and 1504 is to be operated based on an operation sequence according to the interleaving scheme, the controller 130 may perform a one-shot program operation of programming the first data DATA1 in the first TLC block T1 of the first memory device 1501. The controller 130 may delete the first data DATA1 stored in the first buffer 510 while performing the one-shot program operation onto the first memory device 1501.

Before describing FIG. 8, it is assumed that a one-shot program operation is completed in the TLC block of each of the first to third memory devices 1501 to 1503, and a program operation is completed in the SLC block of each of such memory device.

FIG. 8 illustrates an operation of the controller 130 controlling whether to program a data in a TLC block or an SLC block in one memory device among the memory devices 1501, 1502, 1503 and 1504 when the size of the data inputted from the host 102 to the controller 130 is smaller than the one-shot program size, e.g., 96 KB.

Referring to FIG. 8, the controller 130 may store the first data DATA1 inputted from the host 102 in the first buffer 510. The controller 130 may check whether the usage size of the first buffer 510 in which the first data DATA1 is stored is equal to the one-shot program size of 96 KB. As a result, it may be seen that the usage size of the first buffer 510 is smaller than the one-shot program size. In this case, the usage size of the first buffer 510 in which the first data DATA1 is stored is 20 KB. When data having a size smaller than the one-shot program size is stored in a TLC block through a one-shot program operation, the controller 130 may have to generate dummy data to make up the difference. For example, the controller 130 may generate dummy data of 76 KB, which is the difference between the one-shot program size (96 KB) and the size of the first data DATA1 (20 KB), and store the generated dummy data in the TLC cell. When dummy data needs to be generated while a program operation is performed to program data having a small size in the memory device, a program operation may be performed by selecting the TLC block or the SLC block based on the status of the memory device where the data is to be written. In other words, when the memory device where the data is to be written is performing one operation, the data may be directly programmed into the SLC block without the dummy data when the operation being performed is completed. On the other hand, when the memory device where the data is to be written is in an IDLE status, the one-shot program operation may be performed onto the TLC block.

To be specific, the controller 130 may select a TLC block in which the first data DATA1 is to be stored. For example, the controller 130 may select a fourth TLC block T4 in the fourth memory device 1504 to write the first data DATA1. Then, the controller 130 may detect the usage size of the first buffer 510 where the first data DATA1 is stored. As a result, it may be seen that the usage size of the first buffer is 20 KB, which is smaller than the one-shot program size, e.g., 96 KB. Therefore, dummy data may have to be generated when the first data DATA1 is programmed into the fourth TLC block T4. Before performing a program operation onto the TLC block, the controller 130 may check the status of the fourth memory device including the fourth TLC block T4. In other words, the controller 130 may check whether the fourth memory device 1504 is in an IDLE status or not. If it turns out that the fourth memory device 1504 is in an idle status, the controller 130 may write the first data DATA1 and the dummy data in the fourth TLC block T4. On the other hand, if it turns out that the status of the fourth memory device 1504 is not in an idle status, the controller 130 may change the fourth TLC block T4 to the fourth SLC block S4 and program the first data DATA1 into the fourth SLC block S4. In other words, when the status of the fourth memory device 1504 is in a busy status, the one-shot program operation on the fourth TLC block T4 is regarded as not completed. When the one-shot program operation on the fourth memory device 1504 is completed, the first data DATA1 may be programmed into the fourth SLC block S4 to quickly program the first data DATA1.

Figure 9:
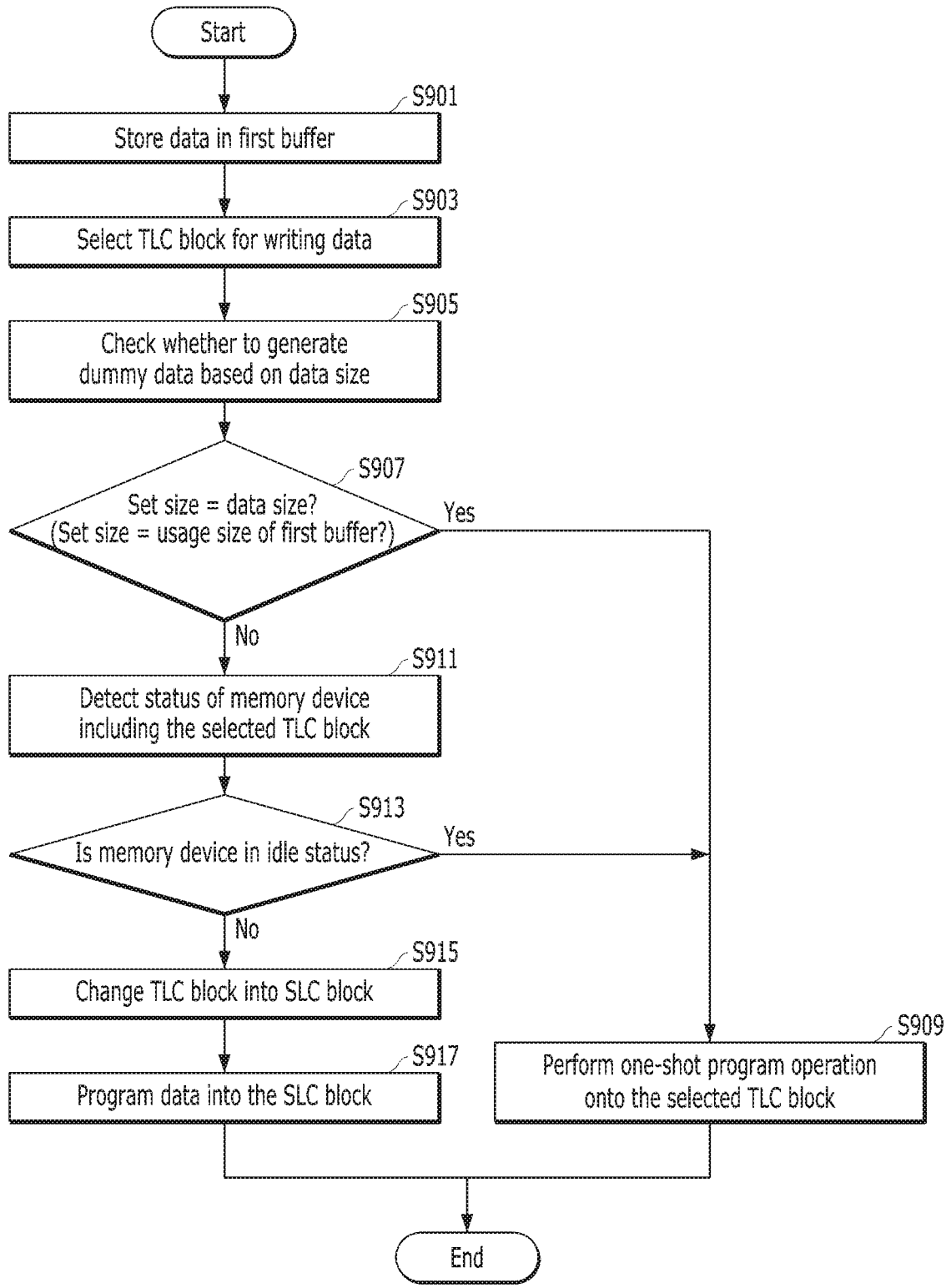
FIG. 9 is a flowchart describing a method of operating the memory system in accordance with an embodiment of the present invention.

FIG. 9 is a flowchart describing a method of operating the memory system 100 in accordance with an embodiment of the present invention.

Referring to FIG. 9, in step S901, the controller 130 may receive write commands from the host 102. The controller 130 may detect the data size and data type of data corresponding to the write commands. The data corresponding to the write commands may include user data and meta-data. The controller 130 may store segments 720 of the data corresponding to the write commands in the memory 144 of the controller 130. The controller 130 may store the user data in the first buffer 510 and store the metadata in the second buffer 520. The illustrated embodiment of the present invention will be described based on user data, which will be referred to as data in such description. For example, the controller 130 may store data DATA received from the host 102 in the first buffer 510.

In step S903, the controller 130 may select a TLC block included in one memory device among the memory devices 1501, 1502, 1503 and 1504 where the data DATA is to be stored. For example, the controller 130 may select the fourth TLC block T4 in the fourth memory device 1504 where the data DATA is to be written.

In steps S905 and S907, the controller 130 may check whether to generate dummy data based on the data size of the data. In other words, the controller 130 may detect the usage size of the first buffer 510 where the data DATA is stored, and check whether the data size of the data is equal to the one-shot program size, which is the reference for performing a one-shot program operation onto the TLC block. The controller 130 may use a one-shot programming method when programming data into the TLC blocks of the memory devices 1501, 1502, 1503 and 1504. The one-shot programming method may refer to an operation of programming multi-bit data into a multi-level cell by performing a program operation once. The data size required for processing a one-shot program operation in one page (not shown) included in the first block of the first memory device 1501 may be defined as the one-shot program size. For example, the one-shot program size is set to 96 KB. Other one-shot program sizes may be used depending on system design considerations. For example, the controller 130 may check the usage size of the first buffer 510 where the data DATA is stored based on the one-shot program size, which is 96 KB.

If it is determined in step S907 that the usage size of the first buffer 510, that is, the data size, is equal to the one-shot program size (Yes), the controller 130 may perform a one-shot program operation of programming the data DATA into the fourth TLC block T4 without dummy data in step S909. For example, when the usage size of the first buffer 510 is 96 KB, which is the one-shot program size in the illustrated embodiment, the controller 130 may not need to generate a dummy data. Therefore, the controller 130 may perform a one-shot program operation of programming the data into the fourth memory device 1504 without dummy data.

On the other hand, if it is determined in step S907 that the usage size of the first buffer 510, that is, the data size, is smaller than the one-shot program size (No), the controller 130 may check whether the status of the fourth memory device 1504 including the fourth TLC block selected in the step S903 is in an idle status or not in step S911. For example, when the usage size of the first buffer 510 is 20 KB, which is smaller than the one-shot program size of 96 KB, dummy data may have to be generated when the data DATA is programmed into the fourth TLC block T4. Before performing a program operation onto the fourth TLC block T4, the controller 130 may check whether the status of the fourth memory device including the fourth TLC block is in an IDLE status or not.

If it is determined in step S913 that the fourth memory device 1504 is in an idle status (Yes), the controller 130 may program the data DATA and the dummy data into the fourth TLC block T4 in step S909.

If it is determined in step S913 that the fourth memory device 1504 is not in an idle status (No), the controller 130 may perform a switching operation from the selected TLC block to the SLC block in step S915 and program the data into the changed SLC block in step S917. For example, when the fourth memory device 1504 is in a busy status, the one-shot program operation on the fourth TLC block T4 of the fourth memory device 1504 is not completed. Accordingly, when the fourth memory device 1504 is in a busy status, a program operation may not be performed into the fourth TLC block. Therefore, when the one-shot program operation on the fourth memory device 1504 is completed, the data may be programmed by changing from the fourth TLC block T4 into the fourth SLC block S4 to write the data DATA quickly.

With reference to FIGS. 10 to 18, a data processing system and electronic appliances, to which the memory system 110 including the memory device 150 and the controller 130 described above, may be applied, in accordance with embodiments, are described.

Figure 10:
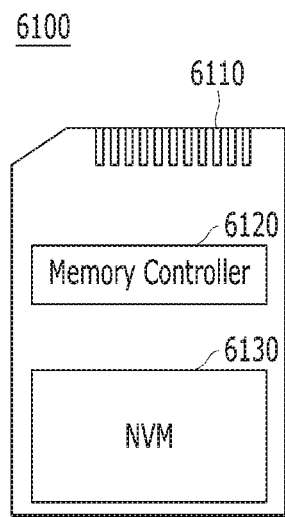
FIGS. 10 to 18 are diagrams illustrating examples of memory systems in accordance with embodiments of the present invention.

FIG. 10 is a diagram illustrating a data processing system including a memory system in accordance with an embodiment. FIG. 10 illustrates a memory card system 6100 to which the memory system is applied.

Referring to FIG. 10, the memory card system 6100 includes a connector 6110, a memory controller 6120 and a memory device 6130.

The memory controller 6120 is connected with, for access to, the memory device 6130, which is implemented as a nonvolatile memory (NVM. For example, the memory controller 6120 controls the read, write, erase and background operations of the memory device 6130. The memory controller 6120 provides an interface between the memory device 6130 and a host (not shown), and drives firmware for controlling the memory device 6130. That is to say, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processor, a host interface, a memory interface and an error correction component.

The memory controller 6120 may communicate with an external device, for example, the host 102 described above with reference to FIG. 1, through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), advanced technology attachment (ATA), serial ATA, parallel ATA, small computer system interface (SCSI), enhanced small disk interface (ESDI), integrated drive electronics (IDE), Firewire, universal flash storage (UFS), WiFi or Wi-Fi and Bluetooth. Accordingly, the memory system and the data processing system may be applied to wired and/or wireless electronic appliances, particularly a mobile electronic appliance.

The memory device 6130 may be implemented by a nonvolatile memory such as an electrically erasable and programmable ROM (EPROM), a NAND flash memory, a NOR flash memory, a phase-change RAM (PRAM), a resistive RAM (ReRAM), a ferroelectric RAM (FRAM) and/or a spin torque transfer magnetic RAM (STT-MRAM).

The controller 6120 and the memory device 6130 may be integrated into one semiconductor device to form a solid state drive (SSD), or a memory card such as a PC card (e.g., personal computer memory card international association (PCMCIA)), a compact flash card (CF), a smart media card (e.g., SM and SMC), a memory stick, a multimedia card (e.g., MMC, RS-MMC, MMCmicro and eMMC), a secure digital (SD) card (e.g., SD, miniSD, microSD and SDHC) or a universal flash storage (UFS).

Figure 11:
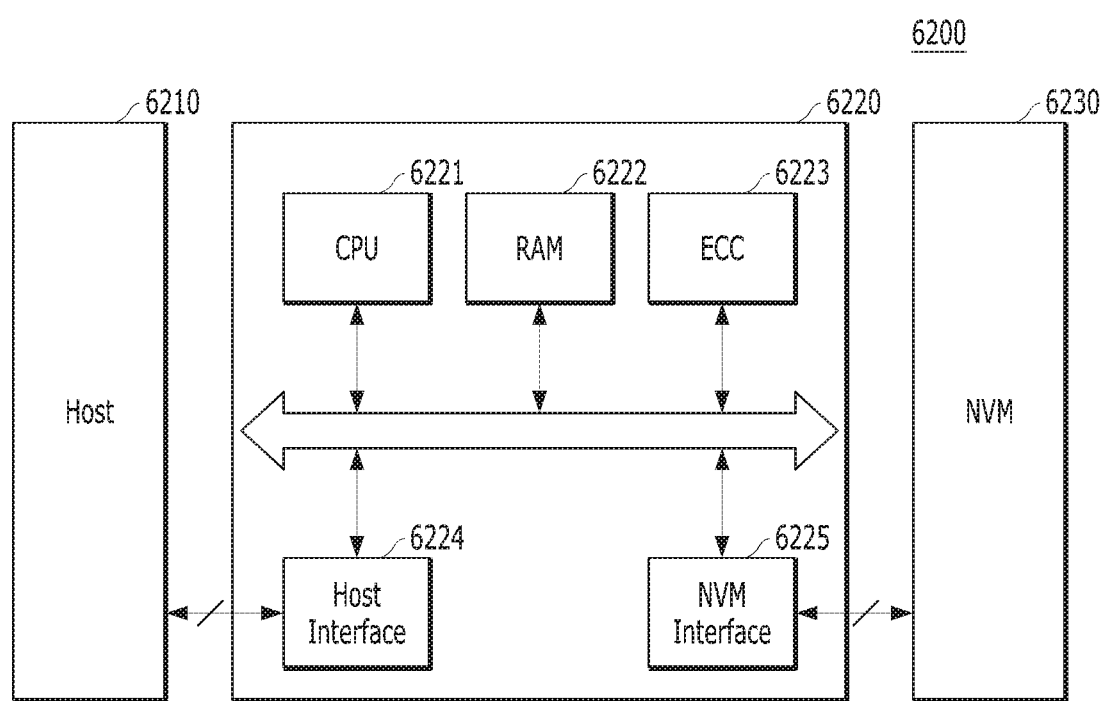

FIG. 11 is a diagram illustrating a data processing system 6200 including a memory system in accordance with an embodiment.

Referring to FIG. 11, the data processing system 6200 includes a memory device 6230 which is implemented by at least one nonvolatile memory (NVM) and a memory controller 6220 which controls the memory device 6230. The data processing system 6200 may be a storage medium such as a memory card (e.g., CF, SD and microSD). The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 controls read, write and erase operations for the memory device 6230 in response to requests from a host 6210. The memory controller 6220 includes at least one CPU 6221, a buffer memory, for example, a RAM 6222, an ECC circuit 6223, a host interface 6224, and a memory interface, for example, an NVM interface 6225.

The CPU 6221 may control general operations for the memory device 6230, for example, read, write, file system management, bad page management, and the like. The RAM 6222 operates according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 of a low speed to operate at a high speed.

The ECC circuit 6223 corresponds to the ECC component 138 of the controller 130 described above with reference to FIG. 1. As described above with reference to FIG. 1, the ECC circuit 6223 generates an error correction code (ECC) for correcting a failed bit or an error bit in the data received from the memory device 6230. Also, the ECC circuit 6223 performs error correction encoding for data to be provided to the memory device 6230, and generates data with added parity bits. The parity bits may be stored in the memory device 6230. The ECC circuit 6223 may perform error correction decoding for data outputted from the memory device 6230. The ECC circuit 6223 may correct errors by using the parity bits. For example, as described above with reference to FIG. 1, the ECC circuit 6223 may correct errors by using any of various coded modulations such as an LDPC code, a BCH code, a turbo code, a Reed-Solomon code, a convolution code, an RSC, a TCM and a BCM.

The memory controller 6220 transmits and receives data to and from the host 6210 through the host interface 6224, and transmits and receives data to and from the memory device 6230 through the NVM interface 6225. The host interface 6224 may be connected with the host 6210 through a PATA bus, a SATA bus, an SCSI, a USB, a PCIe or a NAND interface. Further, as a wireless communication function or a mobile communication protocol such as WiFi or long term evolution (LTE) is implemented, the memory controller 6220 may transmit and receive data by being connected with an external device, for example, the host 6210 or other external device. Specifically, as the memory controller 6220 is configured to communicate with an external device through at least one among various communication protocols, the memory system and the data processing system may be applied to wired and/or wireless electronic appliances, particularly a mobile electronic appliance.

Figure 12:
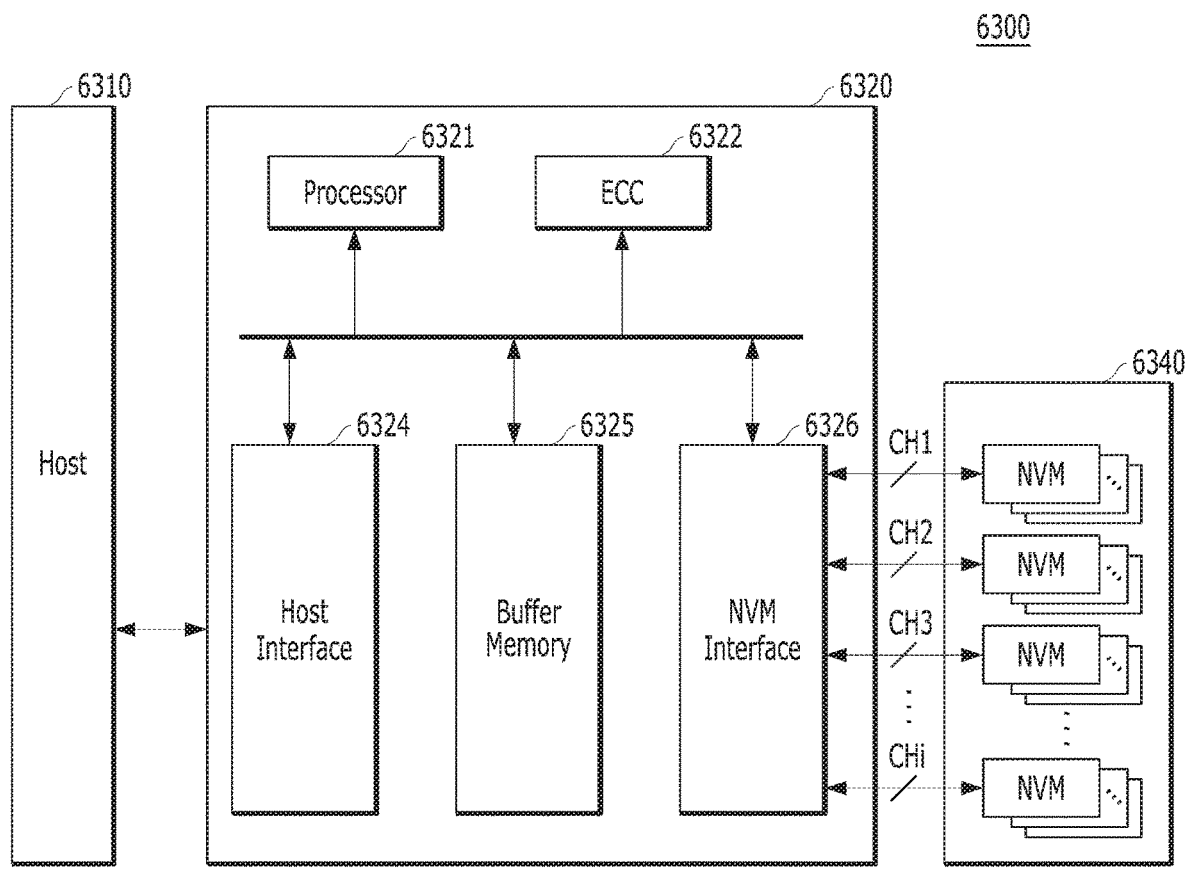

FIG. 12 is a diagram illustrating a data processing system including a memory system in accordance with an embodiment. FIG. 12 illustrates a solid state drive (SSD) 6300 to which the memory system is applied.

Referring to FIG. 12, the SSD 6300 includes a controller 6320 and a memory device 6340 which includes a plurality of nonvolatile memories (NVM). The controller 6320 may correspond to the controller 130 in the memory system 110 described above with reference to FIG. 1, and the memory device 6340 may correspond to the memory device 150 in the memory system 110 described above with reference to FIG. 1.

The controller 6320 is connected with the memory device 6340 through a plurality of channels CH1, CH2, CH3, . . . and CHi. The controller 6320 includes at least one processor 6321, an ECC circuit 6322, a host interface 6324, a buffer memory 6325, and a memory interface, for example, a nonvolatile memory interface 6326.

Figure 13:
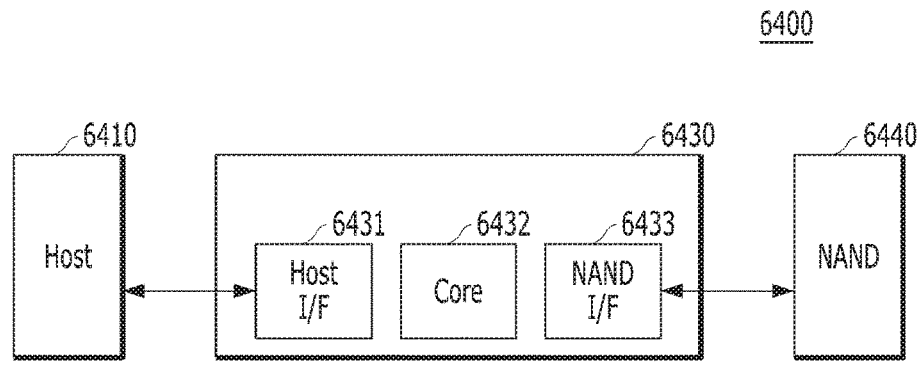

The buffer memory 6325 temporarily stores data received from a host 6310 or data received from a plurality of flash memories NVMs included in the memory device 6340, or temporarily stores metadata of the plurality of flash memories NVMs, for example, map data including mapping tables. The buffer memory 6325 may be realized by a volatile memory such as, but not limited to, a DRAM, an SDRAM, a DDR SDRAM, an LPDDR SDRAM and a GRAM, or a nonvolatile memory such as, but not limited to, an FRAM, an ReRAM, an STT-MRAM and a PRAM. While it is illustrated in FIG. 13 that the buffer memory 6325 is disposed within the controller 6320, the buffer memory 6325 may be disposed external to the controller 6320.

The ECC circuit 6322 calculates error correction code values of data to be programmed in the memory device 6340 in a program operation. The ECC circuit 6322 performs an error correction operation for data read from the memory device 6340, based on the error correction code values, in a read operation. The ECC circuit 6322 performs an error correction operation for data recovered from the memory device 6340 in a recovery operation for failed data.

The host interface 6324 provides an interface function with respect to an external device, for example, the host 6310, and the nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system, for example, a redundant array of independent disks (RAID) system may be implemented. In the RAID system, the plurality of SSDs 6300 and a RAID controller for controlling the plurality of SSDs 6300 may be included. In the case of performing a program operation by receiving a write command from the host 6310, the RAID controller may select at least one memory system, that is, at least one SSD 6300, in correspondence to the RAID level information of the received write command received, among a plurality of RAID levels, that is, the plurality of SSDs 6300, and may output data corresponding to the write command to the selected SSD 6300. Also, in the case of performing a read operation by receiving a read command from the host 6310, the RAID controller may select at least one memory system, that is, at least one SSD 6300, in correspondence to the RAID level information of the received read command, among the plurality of RAID levels, that is, the plurality of SSDs 6300, and may provide data outputted from the selected SSD 6300 to the host 6310.

FIG. 13 is a diagram illustrating a data processing system including a memory system in accordance with an embodiment. FIG. 13 illustrates an embedded multimedia card (eMMC) 6400 to which the memory system is applied.

Referring to FIG. 13, the eMMC 6400 includes a controller 6430 and a memory device 6440 which is implemented by at least one NAND flash memory. The controller 6430 may correspond to the controller 130 in the memory system 110 described above with reference to FIG. 1, and the memory device 6440 may correspond to the memory device 150 in the memory system 110 described above with reference to FIG. 1.

The controller 6430 is connected with the memory device 6440 through a plurality of channels. The controller 6430 includes at least one core 6432, a host interface (I/F) 6431, and a memory interface, i.e., a NAND interface (I/F) 6433.

The core 6432 controls general operations of the eMMC 6400. The host interface 6431 provides an interface function between the controller 6430 and a host 6410. The NAND interface 6433 provides an interface function between the memory device 6440 and the controller 6430. For example, the host interface 6431 may be a parallel interface, for example, an MMC interface, as described above with reference to FIG. 1, and may be a serial interface, for example, an ultra high speed (UHS)-I/UHS-II and/or a UFS interface.

FIGS. 14 to 17 are diagrams illustrating examples of data processing systems including a memory system in accordance with embodiments. Each of FIGS. 14 to 17 illustrates a universal flash storage (UFS) to which the memory system is applied.

Referring to FIGS. 14 to 17, respective UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The respective hosts 6510, 6610, 6710 and 6810 may be wired and/or wireless electronic appliances, in particular, application processors of mobile electronic appliances or the likes. The respective UFS devices 6520, 6620, 6720 and 6820 may be embedded UFS devices. The respective UFS cards 6530, 6630, 6730 and 6830 may be external embedded UFS devices or removable UFS cards.

In the respective UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with external devices, for example, wired and/or wireless electronic appliances, in particular, mobile electronic appliances or the likes, through UFS protocols. The UFS devices 6520, 6620, 6720 and 6820 and the UFS cards 6530, 6630, 6730 and 6830 may be implemented as the memory system 110 described above with reference to FIG. 1. For example, in the respective UFS systems 6500, 6600, 6700 and 6800, the UFS devices 6520, 6620, 6720 and 6820 may be implemented in the form of the data processing system 6200, the SSD 6300 or the eMMC 6400 described above with reference to FIGS. 13 to 15, and the UFS cards 6530, 6630, 6730 and 6830 may be implemented in the form of the memory card system 6100 described above with reference to FIG. 10.

In the respective UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may perform communication through the universal flash storage (UFS) interface, for example, MIPI M-PHY and MIPI Unified Protocol (UniPro) in Mobile Industry Processor Interface (MIPI). The UFS devices 6520, 6620, 6720 and 6820 and the UFS cards 6530, 6630, 6730 and 6830 may perform communication through a protocol other than the UFS protocol, for example, any of various card protocols such as universal storage bus (USB) Flash Drives (UFDs), multi-media card (MMC), secure digital (SD), mini SD and Micro SD.

Figure 14:
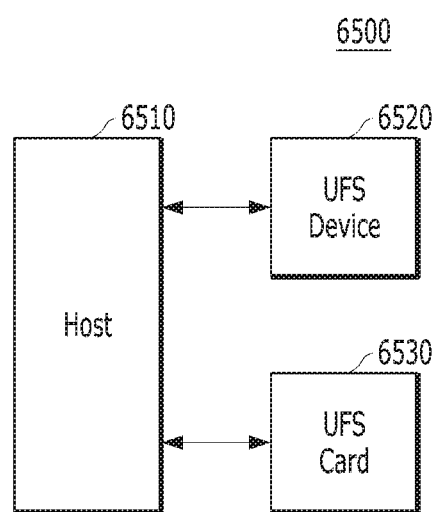

In the UFS system 6500 shown in FIG. 14, UniPro exists in each of the host 6510, the UFS device 6520 and the UFS card 6530. The host 6510 performs a switching operation to perform communication with each of the UFS device 6520 and the UFS card 6530. In particular, the host 6510 performs communication with the UFS device 6520 or the UFS card 6530, through link layer switching in UniPro, for example, L3 switching. The UFS device 6520 and the UFS card 6530 may perform communication through link layer switching in the UniPro of the host 6510. While it is described as an example that one UFS device 6520 and one UFS card 6530 are coupled to the host 6510, it is noted that a plurality of UFS devices and a plurality of UFS cards may be coupled to the host 6510 in a parallel or a star type arrangement.

Also, a plurality of UFS cards may be coupled to the UFS device 6520 in any of a parallel, a star, a serial or a chain type arrangement.

Figure 15:
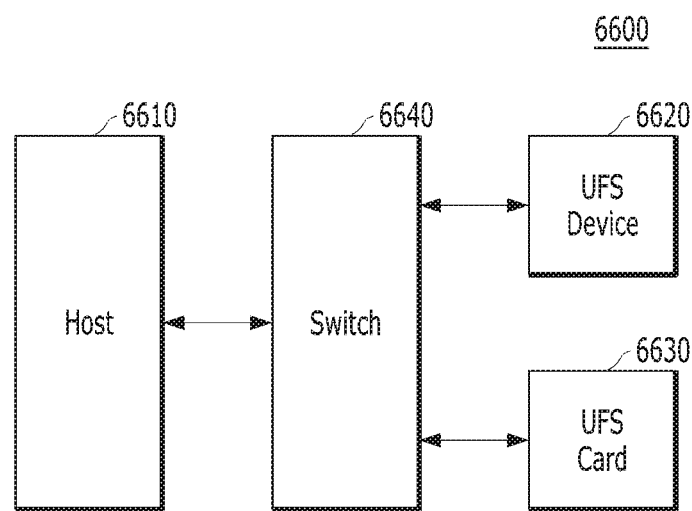

In the UFS system 6600 shown in FIG. 15, UniPro exists in each of the host 6610, the UFS device 6620 and the UFS card 6630. The host 6610 performs communication with the UFS device 6620 or the UFS card 6630 through a switching module 6640 which performs a switching operation, in particular, a switching module 6640 which performs link layer switching in UniPro, for example, an L3 switching operation. The UFS device 6620 and the UFS card 6630 may perform communication through link layer switching in the UniPro of the switching module 6640. While it is described as an example that one UFS device 6620 and one UFS card 6630 are coupled to the switching module 6640, it is noted that a plurality of UFS devices and a plurality of UFS cards may be coupled to the switching module 6640 in a parallel type or a star type arrangement. Also, a plurality of UFS cards may be coupled to the UFS device 6620 in any of a parallel, a star, a serial or a chain type arrangement.

Figure 16:
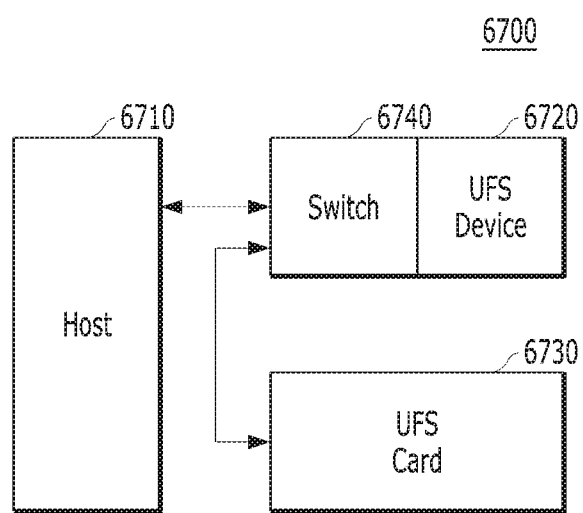

In the UFS system 6700 shown in FIG. 16, UniPro exists in each of the host 6710, the UFS device 6720 and the UFS card 6730. The host 6710 performs communication with the UFS device 6720 or the UFS card 6730 through a switching module 6740 which performs a switching operation, in particular, the switching module 6740 which performs link layer switching in UniPro, for example, an L3 switching operation. The UFS device 6720 and the UFS card 6730 may perform communication through link layer switching in the UniPro of the switching module 6740. The switching module 6740 may be implemented as one module with the UFS device 6720 disposed within or externally to the UFS device 6720. While it is described as an example that one UFS device 6720 and one UFS card 6730 are coupled to the switching module 6740, it is noted that a plurality of modules in which the switching module 6740 and the UFS device 6720 are respectively implemented may be coupled to the host 6710 in a parallel type or a star type arrangement. Also, respective modules may be coupled in a serial type or a chain type arrangement, or a plurality of UFS cards may be coupled to the switching module 6740 in a parallel type or a star type arrangement.

Figure 17:
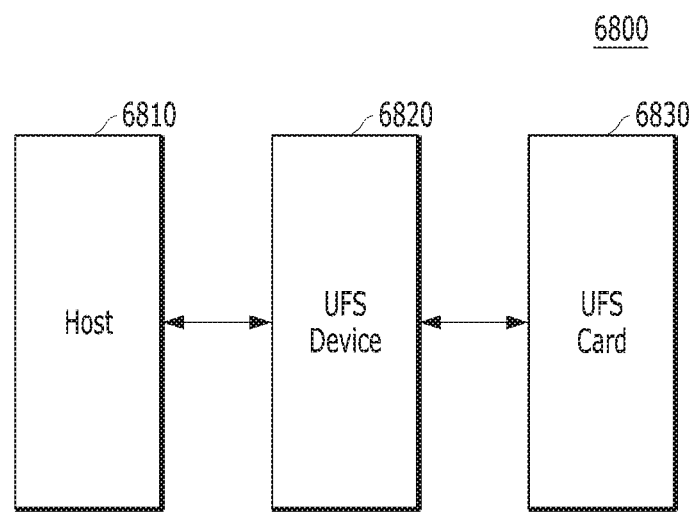

In the UFS system 6800 shown in FIG. 17, M-PHY and UniPro exist in each of the host 6810, the UFS device 6820 and the UFS card 6830. The UFS device 6820 performs a switching operation to perform communication with the host 6810 and the UFS card 6830. In particular, the UFS device 6820 performs communication with the host 6810 or the UFS card 6830, through switching between M-PHY and UniPro modules for communication with the host 6810 and M-PHY and UniPro modules for communication with the UFS card 6830, for example, target identifier (ID) switching. The host 6810 and the UFS card 6830 may perform communication through target ID switching between M-PHY and UniPro modules of the UFS device 6820. While it is described as an example that one UFS device 6820 is coupled to the host 6810 and one UFS card 6830 is coupled to one UFS device 6820, it is noted that a plurality of UFS devices may be coupled to the host 6810 in a parallel type or a star type arrangement. Also, a plurality of UFS cards may be coupled to one UFS device 6820 in any of a parallel, a star, a serial, or a chain type arrangement.

Figure 18:
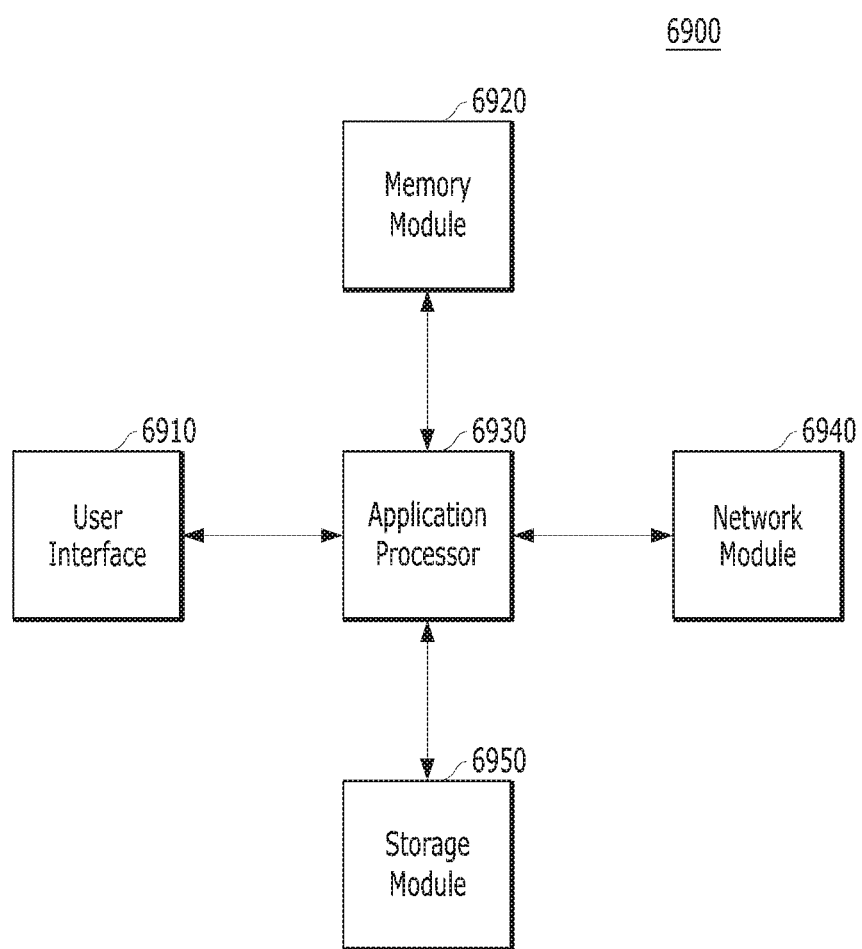

FIG. 18 is a diagram illustrating a data processing system including a memory system in accordance with an embodiment. FIG. 18 illustrates a user system 6900 to which the memory system is applied.

Referring to FIG. 18, the user system 6900 includes a user interface 6910, a memory module 6920, an application processor 6930, a network module 6940, and a storage module 6950.

The application processor 6930 drives components included in the user system 6900 and an operating system (OS). For example, the application processor 6930 may include controllers for controlling the components included in the user system 6900, interfaces, graphics engines, and so on. The application processor 6930 may be provided by a system-on-chip (SoC).

The memory module 6920 may operate as a main memory, a working memory, a buffer memory or a cache memory of the user system 6900. The memory module 6920 may include a volatile random access memory such as a DRAM, an SDRAM, a DDR SDRAM, a DDR2 SDRAM, a DDR3 SDRAM, an LPDDR SDRAM, an LPDDR2 SDRAM and/or an LPDDR3 SDRAM, or a nonvolatile random access memory such as a PRAM, an ReRAM, an MRAM and/or an FRAM. For example, the application processor 6930 and the memory module 6920 may be mounted by being packaged on the basis of a package-on-package (PoP).

The network module 6940 may communicate with external devices. For example, the network module 6940 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), and the like, and may thereby communicate with wired and/or wireless electronic appliances, particularly a mobile electronic appliance. As a result, the memory system and the data processing system may be applied to wired and/or wireless electronic appliances. The network module 6940 may be included in the application processor 6930.

The storage module 6950 may store data, for example, data received from the application processor 6930, and transmit data stored therein, to the application processor 6930. The storage module 6950 may be implemented by a nonvolatile memory such as a phase-change RAM (PRAM), a magnetic RAM (MRAM), a resistive RAM (ReRAM), a NAND flash memory, a NOR flash memory and a 3-dimensional NAND flash memory. Also, the storage module 6900 may be provided as a removable storage medium such as a memory card of the user system 6900 and an external drive. That is to say, the storage module 6950 may correspond to the memory system 110 described above with reference to FIG. 1, and may be implemented as the SSD, eMMC and UFS described above with reference to FIGS. 13 to 18.

The user interface 6910 may include interfaces for inputting data or commands to the application processor 6930 or for outputting data to an external device. For example, the user interface 6910 may include any of various user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMO-LED) display device, an LED, a speaker and a motor.

In the case where the memory system 110 described above with reference to FIG. 1 is applied to the mobile electronic appliance of the user system 6900 in accordance with an embodiment, the application processor 6930 controls general operations of the mobile electronic appliance, and the network module 6940 as a communication module controls wired and/or wireless communication with an external device, as described above. The user interface 6910 as the display and touch module of the mobile electronic appliance displays data processed by the application processor 6930 or supports input of data from a touch panel.

According to the embodiments of the present invention, the memory system may reduce the generation of dummy data by selecting a block based on the size of data and the status of a memory device and improve the performance of a write operation.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A memory system, comprising:
a plurality of memory devices, each of which includes a first block and a second block; and
a controller suitable for:
storing data received from a host in a buffer;
selecting the first block, of a memory device of the plurality of memory devices, to be programmed with the data;
detecting a size of the data;
controlling the memory device to program the data into the selected first block when the size is detected to be equal to a one-shot program size;
determining a status of the memory device including the selected first block when the size is detected to be smaller than the one-shot program size;
controlling the memory device to program the data into the selected first block when the status of the memory device including the selected first block is determined to be in an idle status; and
controlling the memory device to program the data into the second block of the memory device when the status of the memory device including the selected first block is determined to be in a busy status,
wherein the first block has a greater storage capacity than the second block, and the second block accommodates a faster storage speed than that of the first block.

2. The memory system of claim 1, wherein the first block includes one among a multi-level cell (MLC), a triple level cell (TLC) and a quadruple level cell (QLC), and the second block includes a single level cell (SLC).

3. The memory system of claim 1, wherein the one-shot program size represents a size of data with which to perform a one-shot program operation onto the first block.

4. The memory system of claim 1, wherein, when the size is equal to the one-shot program size, the controller performs a one-shot program operation onto the selected first block without generating dummy data.

5. The memory system of claim 1, wherein, when the memory device including the selected first block is in the idle status, the controller generates dummy data and programs the data and the dummy data into the selected first block.

6. The memory system of claim 1, wherein:
when the memory device including the selected first block is in the busy status, the controller changes the selected first block to the second block in the memory device including the selected first block, and when the memory device including the selected first block is in the idle status, the controller controls the memory device to program the data into the selected second block without dummy data.

7. A method for operating a memory system including a plurality of memory devices, each of which includes a first block and a second block, and a controller suitable for controlling the memory devices, the method comprising:
storing data received from a host in a buffer;
selecting a first block of a memory device of the plurality of memory devices, to be programmed with the data;
detecting a size of the data;
controlling the memory device including the selected first block to program the data into the selected first block when the size is detected to be equal to a one-shot program size;
determining a status of the memory device including the selected first block when the size is detected to be smaller than the one-shot program size;
controlling the memory device to program the data into the selected first block when the memory device including the selected first block is in an idle status; and
controlling the memory device to program the data into the second block when the memory device including the selected first block is in a busy status,
wherein the first block has a greater storage capacity than the second block, and the second block accommodates a faster storage speed than that of the first block.

8. The method of claim 7, wherein in controlling the memory device including the selected first block to program the data into the selected first block when the size is detected to be equal to a one-shot program size,
a one-shot program operation is performed onto the first block without generating dummy data.

9. The method of claim 7, wherein the first block includes one among a multi-level cell (MLC), a triple level cell (TLC) and a quadruple level cell (QLC), and the second block includes a single level cell (SLC).

10. The method of claim 7, wherein the one-shot program size represents a size of data with which to perform a one-shot program operation onto the first block.

11. The method of claim 7, wherein in determining the status of the memory device including the first block, it is determined whether the memory device is in an idle status or not.

12. The method of claim 7, wherein the controlling of the memory device including the selected first block to program the data into the selected first block when the memory device including the selected first block is in the idle status includes:
generating dummy data; and
programming the data and the dummy data into the selected first block.

13. The method of claim 7, wherein the controlling of the memory device including the selected first block to program the data into the second block when the memory device including the selected first block is in the busy status includes:
changing the selected first block to the second block in the memory device including the selected first block; and
controlling the memory device including the selected second block to program the data into the selected second block without dummy data.

14. A memory system comprising:
a memory device including first cells and second cells; and
a controller suitable for:
controlling the memory device to perform a one-shot program operation of storing target data into the first cells when a size of the target data is compatible with the one-shot program operation;
controlling the memory device to perform the one-shot program operation of storing the target data and dummy data into the first cells when the size of the target data is not compatible with the one-shot program operation and the memory device is idle; and
controlling the memory device to perform a normal program operation of storing the target data into the second cells when the size of the target data is not compatible with the one-shot program operation and the memory device is busy,
wherein each of the first cells has a greater storage capacity than each of the second cells, and each of the second cells accommodates a faster storage speed than that of each of the first cells.

15. A memory system, comprising:
a plurality of memory devices, each of which include a plurality of blocks included a first block and a second block; and
a controller suitable for:
storing data received from a host in a buffer;
selecting the first block, of a memory device of the plurality of memory devices, to be programmed with the data;
detecting a size of the data;
controlling the memory device to program the data into the selected first block when the size is detected to be equal to a one-shot program size;
determining a status of the memory device including the selected first block when the size is detected to be smaller than the one-shot program size;
controlling the memory device to program the data into the selected first block when the status of the memory device including the selected first block is determined to be in an idle status; and
controlling the memory device to program the data into the second block of the memory device when the status of the memory device including the selected first block is determined to be in a busy status,
wherein the controller classifies and controls the plurality of memory blocks included in each of the plurality of memory devices into the first block and the second block according to storage capacity and storage speed, and
wherein the first block has a greater storage capacity than the second block, and the second block accommodates a faster storage speed than that of the first block.

16. The memory system of claim 15, wherein, when the memory device including the selected first block is in the idle status, the controller generates dummy data and programs the data and the dummy data into the selected first block.

17. The memory system of claim 15, wherein:
when the memory device including the selected first block is in the busy status, the controller changes the selected first block to the second block in the memory device including the selected first block; and
when the memory device including the selected first block is in the idle status, the controller controls the memory device to program the data into the selected second block without dummy data.

* * * * *